United States Patent
Bajaj et al.

(10) Patent No.: US 10,074,559 B1
(45) Date of Patent: Sep. 11, 2018

(54) SELECTIVE PORESEAL DEPOSITION PREVENTION AND RESIDUE REMOVAL USING SAM

(71) Applicant: APPLIED MATERIALS, INC., Santa Clara, CA (US)

(72) Inventors: Geetika Bajaj, New Delhi (IN); Tapash Chakraborty, Mumbai (IN); Prerna Sonthalia Goradia, Mumbai (IN); Robert Jan Visser, Menlo Park, CA (US); Bhaskar Kumar, Santa Clara, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/452,394

(22) Filed: Mar. 7, 2017

(51) Int. Cl.
*H01L 21/32* (2006.01)
*H01L 21/768* (2006.01)

(52) U.S. Cl.
CPC ........ *H01L 21/76831* (2013.01); *H01L 21/32* (2013.01); *H01L 21/76832* (2013.01)

(58) Field of Classification Search
CPC ........... H01L 21/76831; H01L 21/3205; H01L 21/32; H01L 21/76832
See application file for complete search history.

(56) References Cited

U.S. PATENT DOCUMENTS

| | | | |
|---|---|---|---|
| 5,447,599 A | 9/1995 | Li et al. | |
| 6,146,767 A | 11/2000 | Schwartz | |
| 6,197,681 B1 | 3/2001 | Liu | |
| 6,277,745 B1 | 8/2001 | Liu et al. | |
| 6,583,071 B1 | 6/2003 | Weidman et al. | |
| 6,875,687 B1 | 4/2005 | Weidman et al. | |
| 7,456,490 B2 | 11/2008 | Kloster et al. | |
| 7,718,011 B2 | 5/2010 | Fishkin et al. | |
| 8,716,150 B1 | 5/2014 | Sun et al. | |
| 2003/0224591 A1 | 12/2003 | Latchford et al. | |

(Continued)

FOREIGN PATENT DOCUMENTS

WO  2014-209327 A1  12/2014

OTHER PUBLICATIONS

PCT-US2016-053533, "International Search Report and Written Opinion", dated Jan. 11, 2017, 13 pages.

(Continued)

*Primary Examiner* — Mohammad Choudhry
(74) *Attorney, Agent, or Firm* — Kilpatrick Townsend & Stockton LLP (57) ABSTRACT

Methods of discouraging poreseal deposition on metal (e.g. copper) at the bottom of a via during a poresealing process are described. A self-assembled monolayer (SAM) is selectively formed on the exposed metal surface and prevents or discourages formation of poreseal on the metal. The SAM is selectively formed by exposing a patterned substrate to a SAM molecule which preferentially binds to exposed metal surfaces rather than exposed dielectric surfaces. The selected SAM molecules tend to not bind to low-k films. The SAM and SAM molecule are also chosen so the SAM tolerates subsequent processing at relatively high processing temperatures above 140° C. or 160° C. Aliphatic or aromatic SAM molecules with thiol head moieties may be used to form the SAM.

17 Claims, 7 Drawing Sheets

(56) References Cited

U.S. PATENT DOCUMENTS

| | | |
|---|---|---|
| 2004/0203192 A1 | 10/2004 | Gracias |
| 2005/0186339 A1 | 8/2005 | Rajagopalan et al. |
| 2005/0249975 A1 | 11/2005 | Sandberg et al. |
| 2006/0019485 A1 | 1/2006 | Komai et al. |
| 2006/0051931 A1 | 3/2006 | Wellhausen |
| 2006/0105566 A1 | 5/2006 | Waldfried et al. |
| 2006/0128142 A1 | 6/2006 | Whelan et al. |
| 2006/0154471 A1 | 7/2006 | Minami |
| 2007/0032062 A1 | 2/2007 | Lee et al. |
| 2007/0066079 A1 | 3/2007 | Kloster et al. |
| 2007/0134935 A1 | 6/2007 | Waldfried et al. |
| 2008/0042283 A1 | 2/2008 | Purushothaman et al. |
| 2008/0146011 A1 | 6/2008 | Yoon et al. |
| 2010/0029088 A1 | 2/2010 | Mayer et al. |
| 2010/0104852 A1 | 4/2010 | Fletcher et al. |
| 2010/0109161 A1 | 5/2010 | Schuehrer et al. |
| 2010/0178771 A1 | 7/2010 | Oh et al. |
| 2010/0203248 A1 | 8/2010 | Frey et al. |
| 2011/0039061 A1 | 2/2011 | Fedynyshyn et al. |
| 2011/0163062 A1 | 7/2011 | Gordon et al. |
| 2012/0074575 A1 | 3/2012 | Yeom et al. |
| 2012/0088315 A1 | 4/2012 | Merelle et al. |
| 2013/0075876 A1 | 3/2013 | Goethals et al. |
| 2013/0316541 A1 | 11/2013 | Benwadih et al. |
| 2014/0038428 A1* | 2/2014 | Huang ............. H01L 21/76816 |
| | | 438/780 |
| 2014/0084471 A1 | 3/2014 | Peng et al. |
| 2014/0262461 A1 | 9/2014 | Trainor et al. |
| 2017/0346040 A1* | 11/2017 | Fleissner ................. H01L 51/56 |

OTHER PUBLICATIONS

Peng, H. et al. "Pore Sealing by NH3 Plasma Treatment of Porous Low Dielectric Constant Films", Journal of the Electrochemical Society, 154 (4), 2007, pp. G85-G94.

Hashemi et al., 'A New Resist for Area Selective Atomic and Molecular Layer Deposition on Metal-Dielectric Patterns', J. Phys. Chem.C 2014, 118, 10957-10962.

* cited by examiner

SELECTIVE PORESEAL DEPOSITION PREVENTION AND RESIDUE REMOVAL USING SAM

FIELD

Embodiments described herein relate to selectively depositing low-k dielectric sealants.

BACKGROUND

Dielectric materials used in the semiconductor industry have shifted from silicon oxide to porous low-k materials in an effort to reduce dielectric constant and increase performance of integrated circuits. Porous low-k materials with dielectric constants as low as two have been developed. However, porous low-k films are more susceptible to damage from diffusion or plasma processing damage. For example, the porosity may allow process gases or water to penetrate into the low-k dielectric material during some processing operations, such as etching, ashing or CMP. The resulting damage may undesirably increase the dielectric constant of low-k dielectric films. Incorporating a poresealing process may undo damage and also decrease the dielectric constant but may also keep undesirable chemicals from entering the low-k dielectric during subsequent processing. Poresealing processes are used to form a stable thin dielectric barrier spanning the pores. During the poresealing process, poreseal may also undesirably deposit on exposed metal surfaces of a patterned substrate. Poreseal interfaces at electrical connections may increase the resistance and sacrifice performance in a completed device.

Objects of the embodiments presented herein include preventing poreseal residue formation on exposed metal or facilitating removal of the poreseal undesirably formed on exposed metal surfaces.

SUMMARY

Methods of discouraging poreseal deposition on metal (e.g. copper) at the bottom of a via during a poresealing process are described. A self-assembled monolayer (SAM) is selectively formed on the exposed metal surface and prevents or discourages formation of poreseal on the metal. The SAM is selectively formed by exposing a patterned substrate to a SAM molecule which preferentially binds to exposed metal surfaces rather than exposed dielectric surfaces. The selected SAM molecules tend to not bind to low-k films. The SAM and SAM molecule are also chosen so the SAM tolerates subsequent processing at relatively high processing temperatures above 140° C. or 160° C. Aliphatic or aromatic SAM molecules with thiol head moieties may be used to form the SAM.

Embodiments described herein include methods of forming a poreseal layer on a patterned substrate. The methods include placing a patterned substrate into a substrate processing region. The patterned substrate has an exposed low-k dielectric portion and an exposed metal portion disposed in a gap of the exposed low-k dielectric portion. The exposed metal portion is electrically conducting. The methods further include forming a self-assembled monolayer only on the exposed metal portion but not on the exposed low-k dielectric portion by exposing the patterned substrate to an aromatic thiol. The methods further include sealing the exposed low-k dielectric portion from diffusion by forming the poreseal layer. The poreseal layer deposits only on the exposed low-k dielectric portion but not on the exposed metal portion nor on the self-assembled monolayer. The methods further include removing the self-assembled monolayer after forming the poreseal layer to reexpose the exposed metal portion. Removing the self-assembled monolayer leaves the poreseal layer on the exposed low-k dielectric portion. The methods further include depositing a conductor into the gap to form an ohmic contact between the conductor and the exposed metal portion.

The exposed metal portion may include copper. The aromatic thiol may include one of toluene thiol, benzyl mercaptan, thiophene or thiophenol. The substrate processing region may be plasma-free during while forming the poreseal layer. A head moiety of a molecule of the aromatic thiol may include a S H group. A temperature of the patterned substrate while forming the poreseal layer may be greater than 160° C. The methods may further include replenishing the self-assembled monolayer by repeating the sequential operations of (1) forming the self-assembled monolayer and then (2) sealing the exposed low-k dielectric portion from diffusion an integral number of times greater than one.

Embodiments described herein include methods of forming a poreseal layer on a patterned substrate. The method include placing a patterned substrate into a substrate processing region. The patterned substrate has an exposed low-k dielectric portion and an exposed metal portion. The exposed metal portion is electrically conducting. The methods further include forming a self-assembled monolayer only on the exposed metal portion but not on the exposed low-k dielectric portion by exposing the patterned substrate to an aliphatic thiol. The methods further include sealing the exposed low-k dielectric portion from diffusion by forming the poreseal layer. The poreseal layer deposits only on the exposed low-k dielectric portion but not on the exposed metal portion nor on the self-assembled monolayer.

The methods may further include replenishing the self-assembled monolayer by repeating the sequential operations of (1) forming the self-assembled monolayer and then (2) sealing the exposed low-k dielectric portion from diffusion an integral number of times greater than one. The exposed metal portion may be copper. The aliphatic thiol may include one of an alkanethiol, propanethiol, ethanethiol or methanethiol. A temperature of the patterned substrate while forming the poreseal layer may be greater than 140° C. A head moiety of a molecule of the aliphatic thiol may include a S H group. The methods may further include reexposing the exposed metal portion by removing the self-assembled monolayer after sealing the exposed low-k dielectric portion from diffusion.

Embodiments described herein include methods of forming a poreseal layer on a patterned substrate. The methods include placing a patterned substrate into a substrate processing region. The patterned substrate has an exposed low-k dielectric portion and an exposed metal portion. The exposed metal portion is electrically conducting. The methods further include forming a self-assembled monolayer only on the exposed metal portion but not on the exposed low-k dielectric portion by exposing the patterned substrate to one of an aromatic thiol or an aliphatic thiol. The methods further include sealing the exposed low-k dielectric portion from diffusion by forming the poreseal layer. The poreseal layer primarily deposits on the exposed low-k dielectric portion but a second portion deposits on the exposed metal portion. The methods further include removing the second portion from the exposed metal portion while retaining a portion of the porseal layer on the exposed low-k dielectric portion. The methods further include removing the self-assembled monolayer after forming the poreseal layer to reexpose the exposed metal portion. Removing the self-assembled monolayer leaves the poreseal layer on the exposed low-k dielectric portion. The exposed metal portion may include or may be copper. Removing the second portion may include raising a temperature of the patterned substrate. Removing the second portion may include etching.

To better understand the nature and advantages of the present invention, reference should be made to the following description and the accompanying figures. It is to be understood, however, that each of the figures is provided for the purpose of illustration only and is not intended as a definition of the limits of the scope of the present invention.

DESCRIPTION OF THE DRAWINGS

A further understanding of the nature and advantages of the disclosed technology may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of discouraging poreseal deposition on metal (e.g. copper) at the bottom of a via during a poresealing process are described. A self-assembled monolayer (SAM) is selectively formed on the exposed metal surface and prevents or discourages formation of poreseal on the metal. The SAM is selectively formed by exposing a patterned substrate to a SAM molecule which preferentially binds to exposed metal surfaces rather than exposed dielectric surfaces. The selected SAM molecules tend to not bind to low-k films. The SAM and SAM molecule are also chosen so the SAM tolerates subsequent processing at relatively high processing temperatures above 140° C. or 160° C. Aliphatic or aromatic SAM molecules with thiol head moieties may be used to form the SAM. The methods may also facilitate the removal of poreseal from the metal.

Copper damascene and dual-damascene structures have been used for several decades and involve depositing copper into gaps in a patterned low-k dielectric layer. Dual damascene structures include two distinct patterns formed into a dielectric layer. The lower pattern may include via structures whereas the upper pattern may include a trench. The via and the trench are filled at the same time which is the operation for which the dual-damascene process gets its name. The dielectric constant of the low-k dielectric layer may be undesirably increased during subsequent processing so a conformal hermetic layer may be deposited covering both the patterned low-k dielectric layer and the exposed underlying copper layer. "Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". Other similar terms may be used whose meanings will now be clear.

Figure 1A:
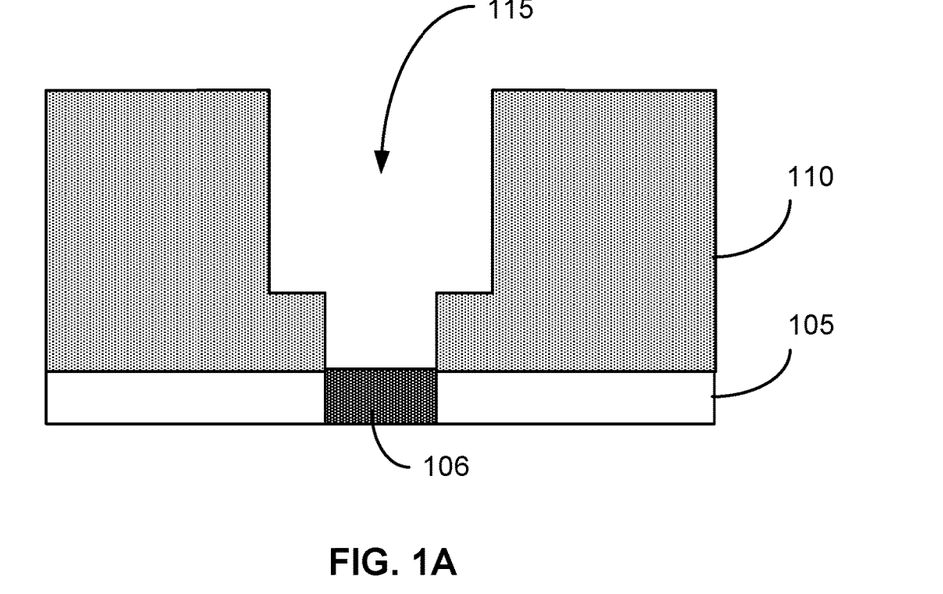
FIGS. 1A, 1B, 1C and 1D are cross-sectional views during a selective sealant process according to embodiments.
Figure 1B:
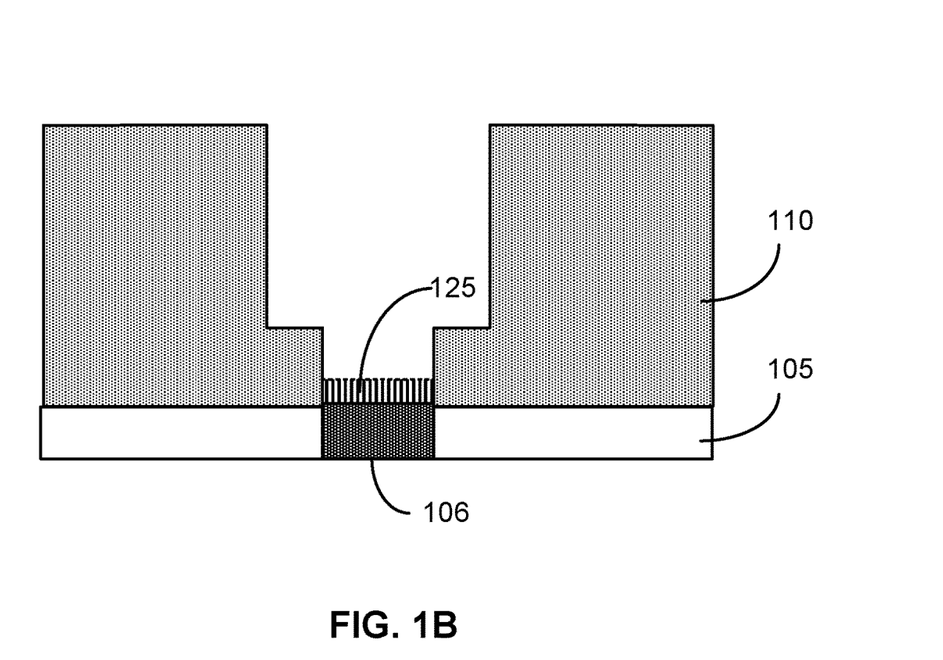
Figure 1C:
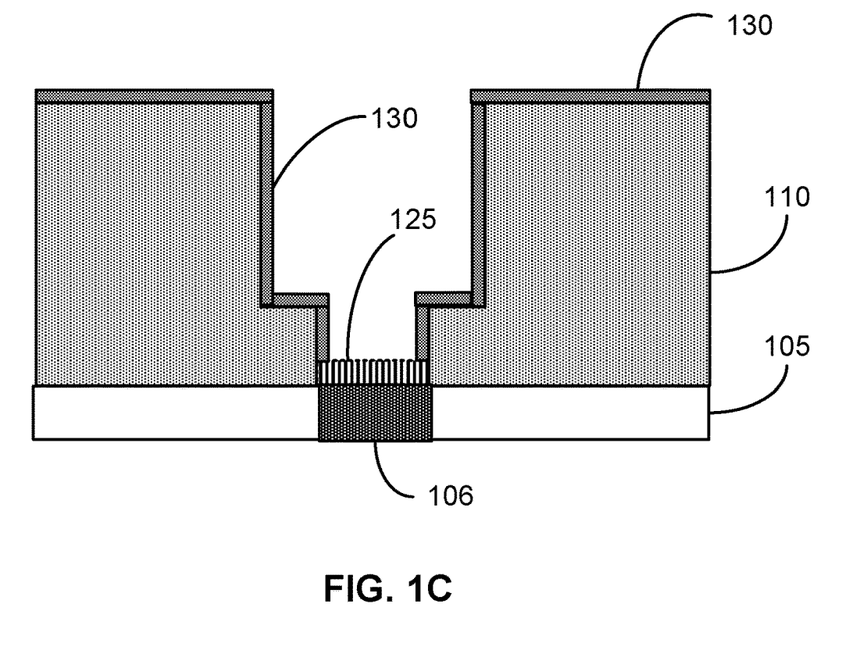
Figure 1D:
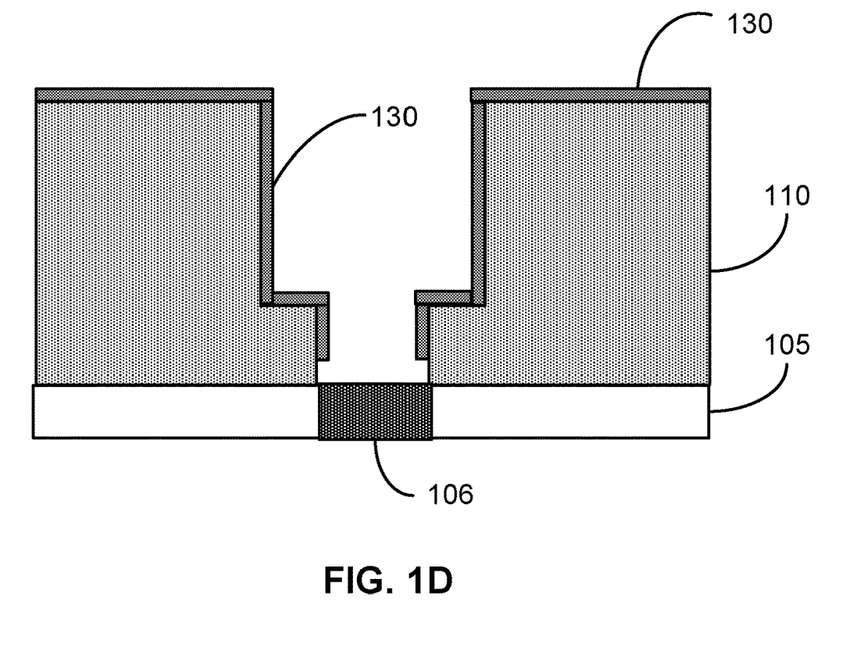

In embodiments, methods of preferentially forming a conformal hermetic layer (poreseal layer) on exposed low-k dielectric portions rather than exposed metal portions which also present on a patterned substrate are described. FIGS. 1A-1D are cross-sectional views during an exemplary selective deposition process according to embodiments. The methods described herein may be generally applied to a wide variety of pattern architectures but the example shown in FIGS. 1A-1D is a dual-damascene process often used to form copper interconnects and vias in a single deposition. An underlying layer 105 has a patterned layer of dielectric 110 having two distinct patterns formed which will collectively be referred to in the example as gap 115. Underlying metal 106 is located underneath gap 115. Dielectric 110 may be a low-k dielectric such as Black Diamond™, which is available from Applied Materials, Santa Clara, Calif. The Black Diamond™ film is an organo-silane film with a lower dielectric constant (e.g., about 3.5 or less) than conventional spacer materials like silicon oxides and nitrides. The low-k dielectric may be silicon oxycarbide (SiOC) and may be porous. However, the techniques described herein work on any exposed dielectric according to embodiments. As illustrated in FIG. 1B, a self-assembled monolayer (SAM) 125 is selectively formed using organic thiol molecules (as detailed below). FIGS. 1B and 1C are for illustration only and the actual thickness of SAM 125 is not shown to scale. A poreseal film 130 is then selectively formed on dielectric 110 as a consequence of a blocking presence of SAM 125 on the underlying metal 106. SAM 125 is then removed and the aftermath is shown in FIG. 1D. FIGS. 1C and 1D are for illustration only and the actual thickness of poreseal 130 is not shown to scale. Metal, such as copper, may then be formed in trench 115 and form an conducting ohmic contact with underlying metal 106 (not shown).

The portion of the poreseal/conformal hermetic layer covering the patterned low-k dielectric layer is desirable. On the other hand, the portion of the poreseal/conformal hermetic layer covering the underlying copper layer may decrease the net conductivity of the electric pathway between the underlying copper layer and an overlying metal layer. The methods described herein have been developed to avoid deposition of poreseal layer on the underlying copper layer while retaining the desirable portion of the conformal hermetic layer covering the patterned low-k dielectric layer. The poreseal layer may be described as a conformal hermetic layer herein. The methods described herein provide the benefit of increasing conductivity and performance of completed devices. An additional benefit is the achievement and maintenance of low dielectric constant in the patterned low-k dielectric layer which also increases performance of completed devices (e.g. higher switching speeds or lower power consumption).

Poreseal deposition on low-k dielectric surfaces help retain the low dielectric constant by forming a "skin" over the outer exposed pores. The skin may prevent chemicals from reaching inner pores through an open porous structure and reacting with the high surface area present inside the low-k dielectric. Metal elements from nearby contacts (e.g. copper) may also be stopped from diffusing into the low-k dielectric which would otherwise raise the dielectric constant and compromise the electrical insulation. The methods described herein ensure the poreseal deposits preferentially or only on the low-k dielectric surfaces rather than on metal surfaces. Benefits of the methods described herein include increasing the conductivity between metal deposited within gaps in the low-k dielectric and an underlying metal layer. The electrical connection between the deposited metal and the underlying metal layer may be ohmic as a result of the methods described according to embodiments.

Deposition of the poreseal onto the underlying metal layer may be avoided, in embodiments, by placing a SAM layer only on the underlying metal layer prior to depositing the poreseal. The SAM layer may be formed by exposing the patterned substrate to SAM molecules having a head moiety and a tail moiety. These head and tail groups are joined by one or more covalent bonds. The tail moiety may make the surface of the underlying metal hydrophobic, which may discourage deposition of the poreseal layer. The SAM molecules self-align, wherein the head moiety is formulated to selectively bond to the copper leaving the tail group disposed at a distal end of the molecule. From the selected classes, the choice of SAM can be varied depending upon the process integration requirements. SAM molecules may be selected to withstand exposure to a minimum temperature, exposure to UV light, exposure to plasma or may withstand being subjected to other aggressive processing conditions.

A poreseal deposition is performed following formation of the SAM. A SAM formed on the metal may be hydrophobic in embodiments. The tail of the SAM precursors described below may also be hydrophobic. A hydrophobic SAM on copper has been found to inhibit or prevent nucleation and growth of poreseal on copper. After some duration of deposition of the poreseal, the SAM may start to degenerate and some deposition of poreseal material may begin to occur on the underlying metal. The delay duration from beginning exposure to beginning deposition of poreseal on the underlying metal becomes shorter at higher substrate temperatures. A benefit of the methods described herein involves an increase in the substrate temperature which is tolerated by the SAM for a same duration of exposure. Another benefit of the methods described herein involves an increase in duration of exposure which is tolerated by the SAM for a same substrate temperature. When poreseal deposition does begin to occur on the damaged SAM, the poreseal deposited on the metal may be removed to regain an exposed underlying metal surface. The SAM may be reinforced or redeposited by reexposing the patterned substrate to SAM molecules before the poreseal begins to deposit on the exposed underlying metal and then restarting or continuing the deposition of the poreseal. Once the poreseal is formed, the adsorbed SAM molecule (the SAM) can be removed with a slight anneal or a plasma.

In the event some undesireable "second portion" of poreseal is deposited on the exposed underlying metal surface, the second portion may be removed by raising the temperature of the substrate or etching to regain the exposed underlying metal surface. The process may then conclude or a SAM may be redeposited to allow further poreseal deposition. Generally speaking, a mild acid and/or a gas-phase etchant may be used according to embodiments. The mild acid may be referred to as a weak acid herein. The weak acid may have a pH between 5 and 7 in embodiments. The weak acid may include one or more of acetic acid, citric acid, formic acid or tartaric acid according to embodiments. The weak acid may be a weak organic acid in embodiments. The weak acid may comprise or consist of carbon, hydrogen and oxygen according to embodiments.

Figure 2:
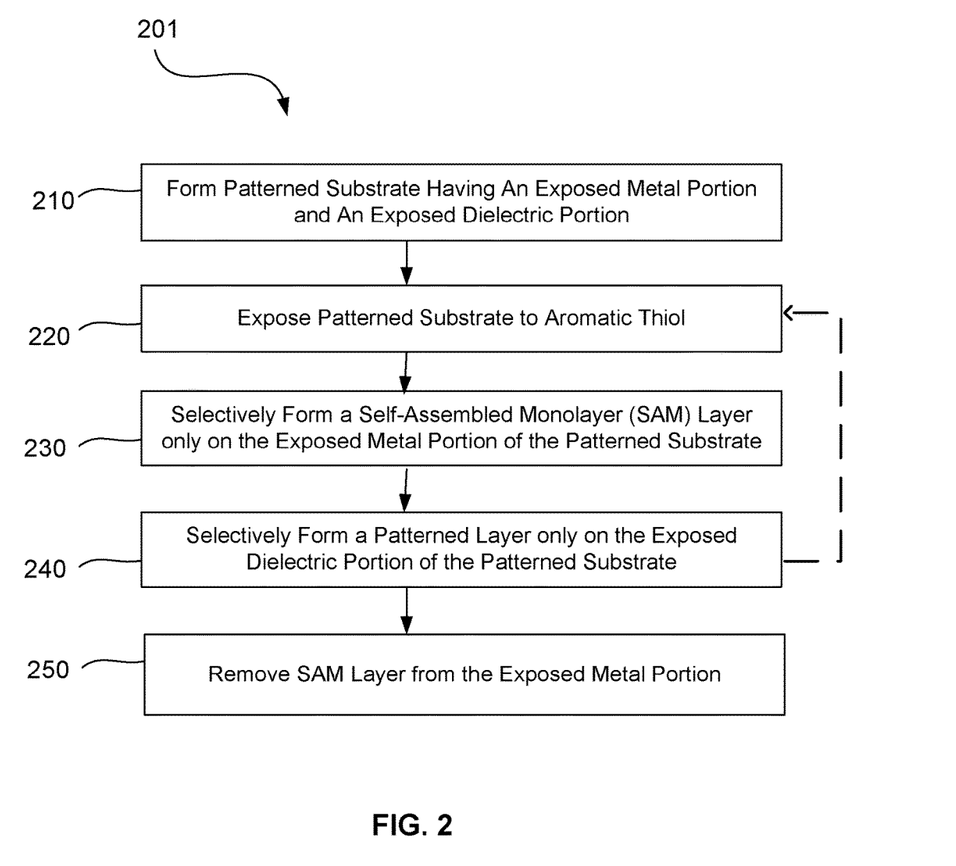
FIG. 2 is method of selectively sealing low-k dielectric material according to embodiments.

To better understand and appreciate the embodiments presented herein, reference is now made to FIG. 2 which is a method 201 of selectively depositing material on exposed dielectric on a patterned substrate according to embodiments. A patterned substrate having an exposed metal portion and an exposed dielectric portion is formed in operation 210. The patterned substrate is exposed to toluene thiol in operation 220. In embodiments, the patterned substrate may be exposed to an aromatic thiol. A SAM is deposited on the exposed metal portion of the patterned substrate in operation 230. SAM molecules of the toluene thiol may diffuse within a liquid solution placed in contact with the exposed metal portion and the exposed dielectric portion of the patterned substrate. In operation 240, a poreseal layer is deposited on the patterned substrate but only on the portions of the patterned substrate which are not covered with the SAM. The SAM layer is removed during operation 250 to reexpose the exposed metal portion which had been temporarily covered with the SAM.

Figure 3:
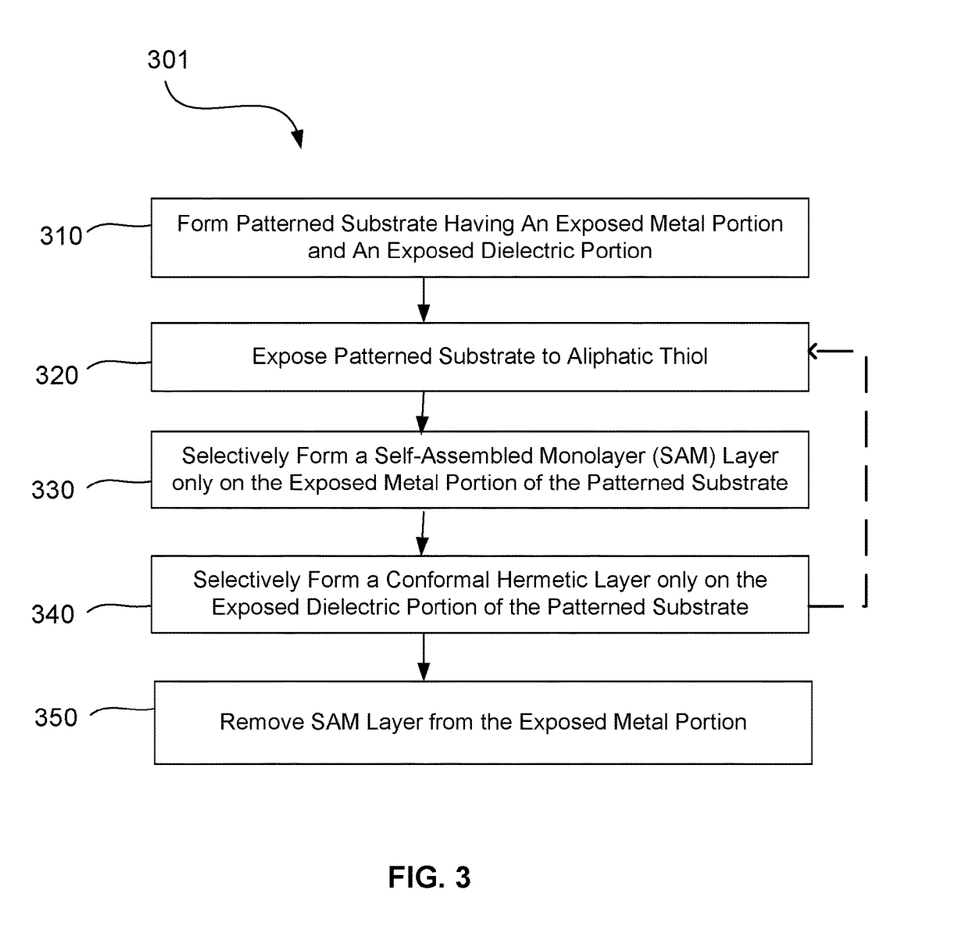
FIG. 3 is method of selectively sealing low-k dielectric material according to embodiments.

Reference is now made to FIG. 3 which is a method 301 of selectively depositing poreseal on exposed dielectric on a patterned substrate according to embodiments. A patterned substrate having an exposed metal portion and an exposed dielectric portion is formed in operation 310. The patterned substrate is exposed to ethanethiol in operation 320. In embodiments, the patterned substrate may be exposed to an aliphatic thiol. A SAM is deposited on the exposed metal portion of the patterned substrate in operation 330. SAM molecules of the ethanethiol may diffuse within a liquid solution placed in contact with the exposed metal portion and the exposed dielectric portion of the patterned substrate. In operation 340, a poreseal layer is deposited on the patterned substrate but only on the portions of the patterned substrate which are not covered with the SAM. The SAM layer is removed during operation 350 to reexpose the exposed metal portion which had been temporarily covered with the SAM.

Selective deposition methods 201 and 301 form a patterned poreseal layer without the typical requirement of depositing photoresist, performing photolithography and etching an initially conformal layer. In embodiments, no photoresist is deposited, no lithography is performed and no etching is performed during operations 240 or 340. Stated another way the poreseal layer may be patterned after formation without applying any intervening lithography or etching operations.

In each of selective deposition methods 201 and 301, the selective deposition of the poreseal layer (240 and 340) may degrade the SAM after tens of seconds or after a minute and the poreseal layer may be undesirably begin to deposit on the exposed metal portion. Operations 220-240 or operations 320-340 may be optionally repeated as shown with the dashed line to repair or redeposit the SAM and enable further selective deposition to occur.

Figure 4A:
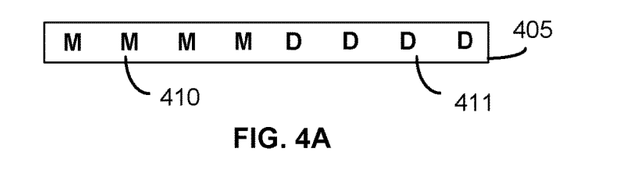
FIGS. 4A, 4B, 4C and 4D are graphical illustrations of the preferential deposition of a SAM on an exposed metal portion of a patterned substrate according to embodiments.
Figure 4B:
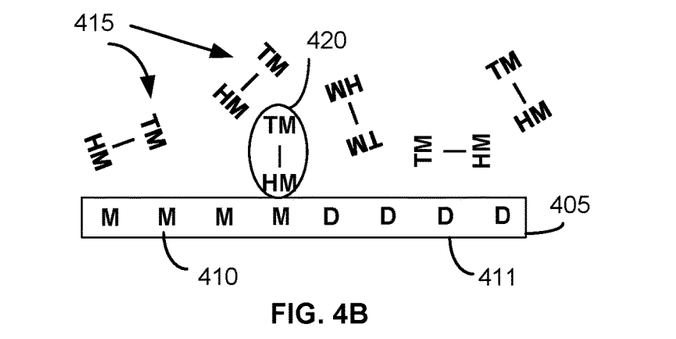
Figure 4C:
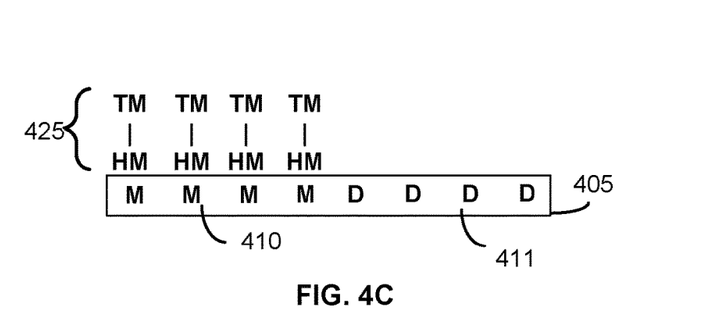
Figure 4D:
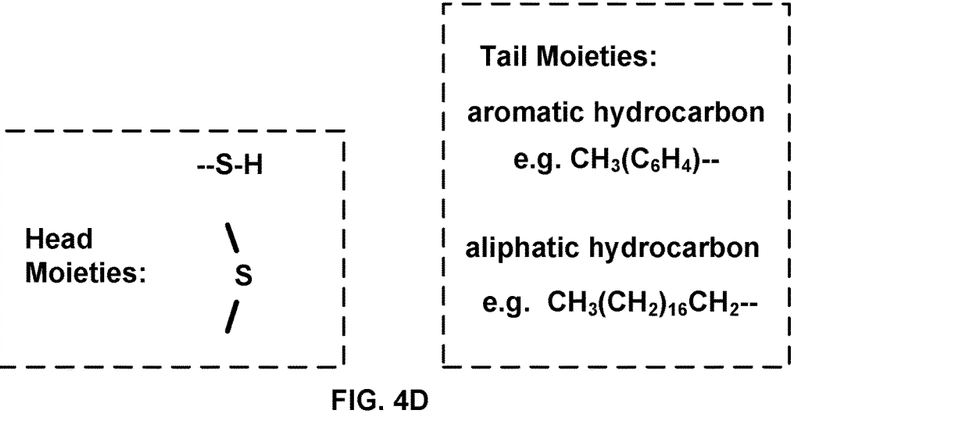

Reference will now be made to FIGS. 4A-4D which are graphical illustrations of the preferential deposition of a SAM on an exposed metal portion of a patterned substrate according to embodiments. A patterned substrate having an exposed metal portion and an exposed dielectric portion is shown in FIG. 4A. FIG. 4A illustrates a patterned substrate 405 having both metal bonding sites 410 (denoted "M") and dielectric sites 411 (denoted "D") on exposed surfaces of the patterned substrate. Each metal bonding site 410 is designated with an "M" which represents a location where molecules may form chemical bonds with metal atoms disposed on an outer surface of patterned substrate 405. In some embodiments "M" may be a transition metal or an alloy of metals. "M" may represent a copper atom at the surface of an exposed metal portion in either of selective deposition methods 201 and 301. SAM molecule 415 comprises a head moiety "HM" at a first end of the molecule and a tail moiety "TM" at a distal end of the molecule. These head and tail moieties may be referred to as "functional groups". SAM 425 is a monolayer of SAM molecules 415 after adsorption onto patterned substrate 405 as shown in FIG. 4C. The HM is —S—H as shown in the left portion of FIG. 4D and the TM may be an aromatic hydrocarbon and/or a covalently bonded chain of carbon (an alkyl chain) as shown in the right portion of FIG. 4D. The chain may consist only of covalently bonded carbons, in embodiments, with hydrogens and/or fluorine atoms terminating the otherwise dangling bonds of the carbons. The TM of the SAM molecule may include an aromatic ring according to embodiments.

Figure 5A:
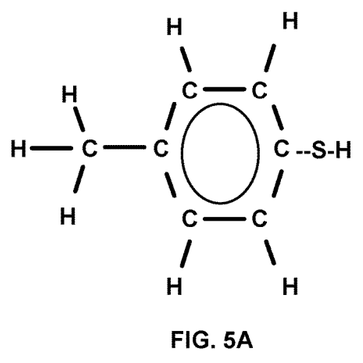
FIGS. 5A, 5B, 5C, 5D, 5E, 5F and 5G are graphical illustrations of exemplary SAM precursors according to embodiments.
Figure 5B:
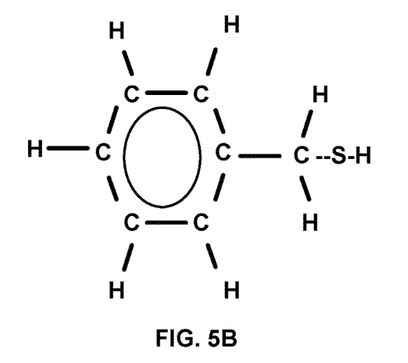
Figure 5C:
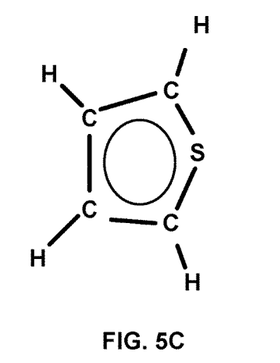
Figure 5D:
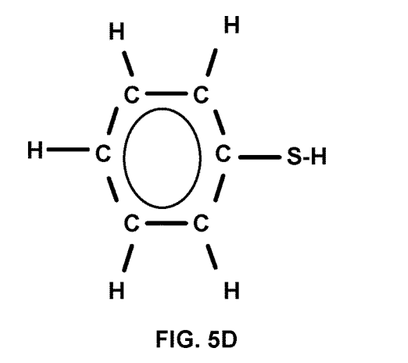

FIGS. 5A, 5B, 5C, 5D, 5E, 5F and 5G are graphical illustrations of exemplary SAM molecules according to embodiments. The precursors used to deposit the self-assembled monolayers herein may be described as SAM molecules especially when tail moieties (TM) and head moieties (HM) and minute interactions between the precursors and the patterned substrate are being described. The tail may impart hydrophobicity which discourages the poreseal deposition. The tail moiety (TM) functions to prevent or discourage nucleation of the poreseal layer in embodiments. Collectively, SAM molecules may be referred to as a SAM precursor. FIGS. 5A, 5B, 5C and 5D show examples of SAM molecules having an aromatic ring. Self-assembled monolayers (SAM) formed using aromatic SAM molecules have been found to tolerate higher substrate temperatures before the SAM is degraded and undesirable deposition on the exposed metal portion begins. SAMs formed using aromatic SAM molecules may tolerate substrate temperatures greater than 160° C., greater than 165° C., greater than 170° C. or greater than 175° C. according to embodiments. In embodiments, the SAM molecule may be toluene thiol ($CH_3$ ($C_6H_4$)—SH) as shown in FIG. 5A. The SAM molecule may be benzyl mercaptan ($C_6H_5CH_2SH$) as shown in FIG. 5B. The SAM molecule may be thiophene ($C_4H_4S$) as shown in FIG. 5C. The SAM molecule may be thiophenol ($C_6H_5SH$) as shown in FIG. 5D in embodiments.

Figure 5E:
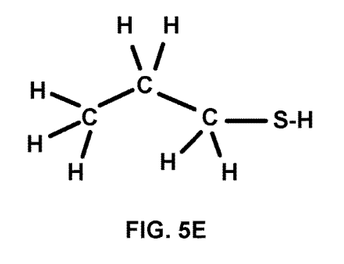
Figure 5F:
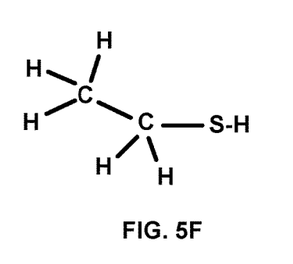
Figure 5G:
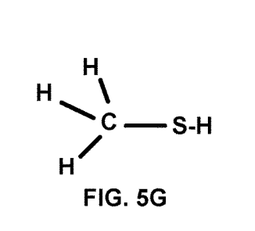

FIGS. 5E, 5F and 5G show examples of aliphatic SAM molecules. Self-assembled monolayers (SAM) formed using aliphatic SAM molecules have been found to tolerate sufficiently high substrate temperatures in some applications. SAMs formed using aliphatic SAM molecules may tolerate substrate temperatures greater than 135° C., greater than 140° C., greater than 145° C. or greater than 150° C. according to embodiments. In embodiments, the SAM molecule may be propanethiol ($C_3H_8S$) as shown in FIG. 5E. The SAM molecule may be ethanethiol ($C_2H_5S$) as shown in FIG. 5F. The SAM molecule may be methanethiol ($CH_3S$) as shown in FIG. 5G.

The deposition rate of the poreseal layer over the SAM/metal is much less than with the deposition rate of the poreseal layer over the exposed dielectric portion (which is not covered by the self-assembled monolayer). The deposition rate of the poreseal layer over the SAM/metal may be reduced by the presence of the SAM and the deposition rate may be much less than if the SAM were not present. In embodiments, the deposition rate over the exposed dielectric portion may be more than one hundred times, more than one hundred fifty times or more than two hundred times the growth rate over the SAM (over the exposed metal portion). The deposition rate over an exposed metal portion uncovered by a SAM may be more than one hundred times, more than one hundred fifty times or more than two hundred times the growth rate over a SAM covered otherwise-exposed metal portion.

The exposed metal portion may be electrically conducting according to embodiments. The exposed metal portion may comprise at least one of copper, nickel, cobalt, halfnium, tantalum and tungsten in embodiments. The exposed metal portion may consist of one or more of copper, nickel, cobalt, halfnium, tantalum and tungsten according to embodiments. Copper, nickel, cobalt, halfnium, tantalum and tungsten are examples of "metal" elements for all materials described herein and indicate that a material consisting only of the "metal" element will electrically conducting to a degree suitable for use in electrical wiring. According to embodiments. The exposed metal portion may consist of a transition metal or a combination of transition metals in embodiments. The exposed dielectric portion may be a low-k dielectric layer which may possess pores in an open cell structure and may benefit from the application of a poreseal layer according to embodiments.

Figure 6:
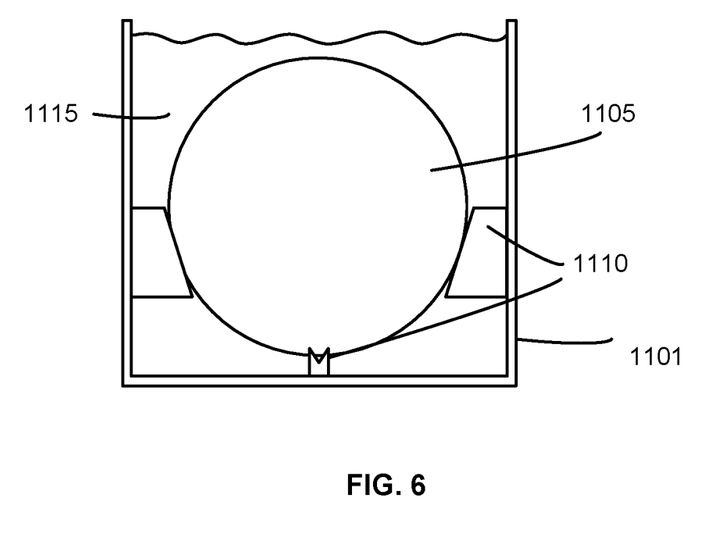
FIG. 6 is a schematic view of substrate processing equipment according to embodiments.

FIG. 6 is a schematic view of substrate processing equipment according to embodiments. FIG. 6 shows hardware used to expose substrate 1105 to a dilute toluene thiol liquid solution 1115 in a tank 1101. Substrate 1105 may be lowered into solution 1115 using a robot and may be supported by substrate supports 1110 during processing.

The terms poreseal and conformal hermetic layer are used interchangeably herein. The conformal hermetic layer is conformal over the features of the patterned substrate and contacts the underlying metal layer directly in embodiments. The conformal hermetic layer may also contact the low-k dielectric layer directly according to embodiments. The conformal hermetic layer may be a silicon-and-carbon-containing layer in embodiments. The conformal hermetic layer may comprise or consist of silicon, carbon and nitrogen, according to embodiments, and may be referred to as silicon carbon nitride or Si—C—N. The conformal hermetic layers described herein may inhibit diffusion of subsequently-introduced etchants or moisture and may therefore protect the integrity of low-k dielectric layer during and after processing in embodiments. The conformal hermetic layers may help to avoid diffusion of copper into the low-k dielectric layer as well, according to embodiments.

The thickness of the conformal hermetic layer should be sufficient to form a hermetic seal configured to keep moisture out of the low-k dielectric layer. The thickness should be less than a threshold amount to enable enough conducting material (e.g. copper) to desirably fill the gaps in the patterned low-k dielectric layer and form conducting contacts. The thickness of the conformal hermetic layer may be greater than 15 Å or greater than 20 Å, according to embodiments, following deposition. The thickness of the conformal hermetic layer may be less than 30 Å or less than 40 Å, in embodiments, after deposition. The conformal hermetic layer may be deposited by UV-assisted chemical vapor deposition (UV-CVD).

The term "gap" is used throughout with no implication that the geometry has a large horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. The term "via" is used to refer to a low aspect ratio trench (as viewed from above) which may or may not be filled with metal to form a vertical electrical connection. As used herein, a conformal deposition process refers to a generally uniform removal of material on a surface in the same shape as the surface, i.e., the surface of the deposited layer and the underlying surface are generally parallel. A person having ordinary skill in the art will recognize that the conformal layer likely cannot be 100% conformal and thus the term "generally" allows for acceptable tolerances.

The trench and/or via structures may be referred to as a gap. The gap lined with the conformal hermetic layer may be a dual-damascene structure including a via underlying a trench. The via may be a low aspect ratio gap and may be, e.g., circular as viewed from above the patterned substrate laying flat. The structure may be at the back end of the line which may result in larger dimensions depending on the device type. A width of the via may be less than 50 nm, less than 40 nm, less than 30 nm or less than 20 nm according to embodiments. A width of the trench may be less than 70 nm, less than 50 nm, less than 40 nm or less than 30 nm in embodiments. The dimensions described herein apply to structures involving a single-patterned low-k dielectric layer or a multi-patterned low-k dielectric layer (e.g. dual-damascene structure). An aspect ratio of the via may be about 1:1, as viewed from above, whereas an aspect ratio of the trench may be greater than 10:1 since the trench is used to contain a conductor meant to electrically attach multiple vias.

The term "precursor" is used to refer to any process gas which takes part in a reaction to either remove material from or deposit material onto a surface. The phrase "inert gas" refers to any gas which does not form chemical bonds during processing even when incorporated into a film. Exemplary inert gases include noble gases but may include other gases so long as no covalent bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the claims, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of forming a poreseal layer on a patterned substrate, the method comprising:
    placing a patterned substrate into a substrate processing region, wherein the patterned substrate has an exposed low-k dielectric portion and an exposed metal portion disposed in a gap of the exposed low-k dielectric portion and wherein the exposed metal portion is electrically conducting;
    forming a self-assembled monolayer only on the exposed metal portion but not on the exposed low-k dielectric portion by exposing the patterned substrate to an aromatic thiol;
    sealing the exposed low-k dielectric portion from diffusion by forming the poreseal layer, wherein the poreseal layer deposits only on the exposed low-k dielectric portion but not on the exposed metal portion nor on the self-assembled monolayer;
    removing the self-assembled monolayer after forming the poreseal layer to reexpose the exposed metal portion, wherein removing the self-assembled monolayer leaves the poreseal layer on the exposed low-k dielectric portion; and
    depositing a conductor into the gap to form an ohmic contact between the conductor and the exposed metal portion.

2. The method of claim 1 wherein the exposed metal portion comprises copper.

3. The method of claim 1 wherein the aromatic thiol comprises one of toluene thiol, benzyl mercaptan, thiophene or thiophenol.

4. The method of claim 1 wherein the substrate processing region is plasma-free during while forming the poreseal layer.

5. The method of claim 1 wherein a head moiety of a molecule of the aromatic thiol includes a S—H group.

6. The method of claim 1 wherein a temperature of the patterned substrate while forming the poreseal layer is greater than 160° C.

7. The method of claim 1 further comprising replenishing the self-assembled monolayer by repeating the sequential operations of (1) forming the self-assembled monolayer and then (2) sealing the exposed low-k dielectric portion from diffusion an integral number of times greater than one.

8. A method of forming a poreseal layer on a patterned substrate, the method comprising:
    placing a patterned substrate into a substrate processing region, wherein the patterned substrate has an exposed low-k dielectric portion and an exposed metal portion and wherein the exposed metal portion is electrically conducting;
    forming a self-assembled monolayer only on the exposed metal portion but not on the exposed low-k dielectric portion by exposing the patterned substrate to an aliphatic thiol; and sealing the exposed low-k dielectric portion from diffusion by forming the poreseal layer, wherein the poreseal layer deposits only on the exposed low-k dielectric portion but not on the exposed metal portion nor on the self-assembled monolayer.

9. The method of claim 8 further comprising replenishing the self-assembled monolayer by repeating the sequential operations of (1) forming the self-assembled monolayer and then (2) sealing the exposed low-k dielectric portion from diffusion an integral number of times greater than one.

10. The method of claim 8 wherein the exposed metal portion comprises copper.

11. The method of claim 8 wherein the aliphatic thiol comprises one of an alkanethiol, propanethiol, ethanethiol or methanethiol.

12. The method of claim 8 wherein a temperature of the patterned substrate while forming the porseal layer is greater than 140° C.

13. The method of claim 8 wherein a head moiety of a molecule of the aliphatic thiol includes a S—H group.

14. The method of claim 8 further comprising reexposing the exposed metal portion by removing the self-assembled monolayer after sealing the exposed low-k dielectric portion from diffusion.

15. A method of forming a poreseal layer on a patterned substrate, the method comprising:

placing a patterned substrate into a substrate processing region, wherein the patterned substrate has an exposed low-k dielectric portion and an exposed metal portion and wherein the exposed metal portion is electrically conducting;

forming a self-assembled monolayer only on the exposed metal portion but not on the exposed low-k dielectric portion by exposing the patterned substrate to one of an aromatic thiol or an aliphatic thiol;

sealing the exposed low-k dielectric portion from diffusion by forming the poreseal layer, wherein the poreseal layer primarily deposits on the exposed low-k dielectric portion but a second portion deposits on the exposed metal portion;

removing the second portion from the exposed metal portion while retaining a portion of the porseal layer on the exposed low-k dielectric portion; and removing the self-assembled monolayer after forming the poreseal layer to reexpose the exposed metal portion, wherein removing the self-assembled monolayer leaves the poreseal layer on the exposed low-k dielectric portion.

16. The method of claim 15 wherein the exposed metal portion comprises copper.

17. The method of claim 15 wherein removing the second portion comprises raising a temperature of the patterned substrate or etching.

* * * * *